United States Patent
Bang et al.

(10) Patent No.: US 10,453,973 B2
(45) Date of Patent: Oct. 22, 2019

(54) TITANIUM OXIDE HAVING HEXAGONAL COLUMN SHAPE, METHOD OF FABRICATING THE SAME, SOLAR CELL INCLUDING THE SAME, AND METHOD OF FABRICATING SOLAR CELL INCLUDING THE SAME

(71) Applicant: Industry-University Cooperation Foundation Hanyang University Erica Campus, Ansan-si, Gyeonggi-do (KR)

(72) Inventors: Jinho Bang, Ansan-si (KR); Eunjoo Lee, Ansan-si (KR)

(73) Assignee: Industry-University Cooperation Foundation Hanyang University Erica Campus, Ansan-si, Gyeonggi-do (KR)

(*) Notice: Subject to any disclaimer, the term of this patent is extended or adjusted under 35 U.S.C. 154(b) by 347 days.

(21) Appl. No.: 15/300,137

(22) PCT Filed: Oct. 28, 2014

(86) PCT No.: PCT/KR2014/010198
§ 371 (c)(1),
(2) Date: Sep. 28, 2016

(87) PCT Pub. No.: WO2015/147398
PCT Pub. Date: Oct. 1, 2015

(65) Prior Publication Data
US 2017/0141246 A1 May 18, 2017

(30) Foreign Application Priority Data
Mar. 28, 2014 (KR) .................. 10-2014-0036417

(51) Int. Cl.
H01L 31/00 (2006.01)
H01L 31/0224 (2006.01)
(Continued)

(52) U.S. Cl.
CPC .... *H01L 31/022425* (2013.01); *C01G 23/053* (2013.01); *H01G 9/2031* (2013.01); *C01P 2004/03* (2013.01); *C01P 2004/40* (2013.01)

(58) Field of Classification Search
CPC ............ H01L 31/022425; H01L 31/00; C01G 23/053
(Continued)

(56) References Cited

U.S. PATENT DOCUMENTS 3,929,963 A * 12/1975 Kurata ................ C22B 34/1213
                                                         423/150.1
8,894,890 B2 * 11/2014 Lee ........................ B82Y 30/00
                                                         252/519.33
(Continued)

FOREIGN PATENT DOCUMENTS

CN 102513079 A 6/2012
CN 102627320 * 8/2012
(Continued)

OTHER PUBLICATIONS

Liu, et al. "Anatase TiO2 with dominant high-energy {001} facets: synthesis, properties, and applications." Chemistry of Materials 23.18 (2011): 4085-4093.*

(Continued)

*Primary Examiner* — Steven J Bos
(74) *Attorney, Agent, or Firm* — Finch & Maloney PLLC

(57) ABSTRACT

A method of fabricating titanium oxide having a hexagonal column shape is provided. The fabricating method includes preparing a first mixture solution containing oxalic acid and sodium dodecylbenzenesulfonate (SDBS), and adding a second mixture solution including titanium to the first mixture solution to fabricate titanium oxide having a hexagonal column shape.

8 Claims, 12 Drawing Sheets

(51) Int. Cl.
*C01G 23/053* (2006.01)
*H01G 9/20* (2006.01)

(58) Field of Classification Search
USPC .................................... 423/69, 85, 609–614
See application file for complete search history.

(56) References Cited

U.S. PATENT DOCUMENTS

2011/0318249 A1   12/2011   Nakayama et al.
2015/0083218 A1   3/2015    Matsumoto

FOREIGN PATENT DOCUMENTS

KR   10-2009-0107340       10/2009
WO       2013179706 A1     12/2013

OTHER PUBLICATIONS

Ramakrishna et al, "Optical and photochemical properties of sodium dodecylbenzenesulfonate-capped TiO2 nanoparticles dispersed in nonaqueous solvents" Langmuir, 2003, 19, 505-8. (Year: 2003).*
Abstract page For CN-102627320 A. (Year: 2012).*
Translation of CN-102627320 A. (Year: 2012).*

* cited by examiner

FIG. 5
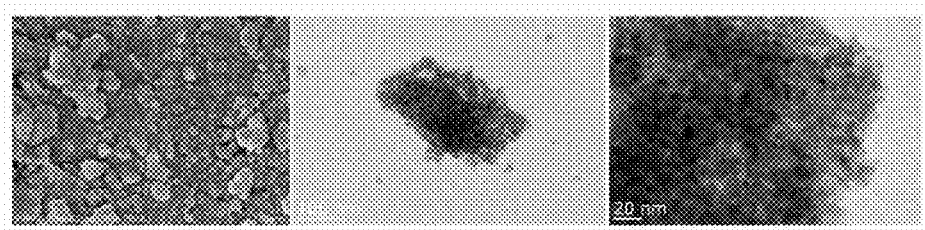
(a)
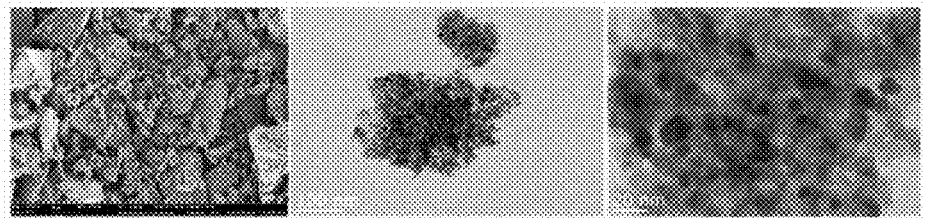
(b)

TITANIUM OXIDE HAVING HEXAGONAL COLUMN SHAPE, METHOD OF FABRICATING THE SAME, SOLAR CELL INCLUDING THE SAME, AND METHOD OF FABRICATING SOLAR CELL INCLUDING THE SAME

CROSS-REFERENCE TO RELATED APPLICATIONS

This application is a National Stage Entry of International Application PCT/KR2014/010198 (filed 28 Oct. 2014), which, claims priority to Republic of Korea Patent Application 10-2014-0036417 (filed 28 Mar. 2014). The entire disclosure of both of these priority applications is hereby incorporated by reference herein.

BACKGROUND

1. Field

Embodiments of the inventive concepts relate to titanium oxide having a hexagonal column shape, a method of fabricating the same, a solar cell including the same, and a method of fabricating a solar cell including the same. More particularly, embodiments of the inventive concepts relate to hexagonal column-shaped titanium oxide fabricated using oxalic acid and sodium dodecylbenzenesulfonate (SDBS), a method of fabricating the same, a solar cell including the same, and a method of fabricating a solar cell including the same.

2. Description of the Related Art

A solar cell is a photovoltaic energy conversion system that converts light energy emitted from the sun into electric energy.

A silicon solar cell uses a P-N junction diode for the photovoltaic energy conversion. However, silicon used in the silicon solar cell should have a high degree of purity and a low number of defects in order to prevent premature recombination of electrons and holes. Since these technical requirements increase costs of used materials, a preparation cost of the silicon solar cell per unit of power is high. In addition, since only photons, energies of which are equal to or higher than a band dap ban gap, are used to generate a current, the silicon of the silicon solar cell should be doped to have a band gap that is low as possible. However, electrons excited by blue light or ultraviolet light have excessive energies due to the low band gap, and thus they may not be used to generate a current but may be consumed as heat. Furthermore, a P-type layer should be sufficiently thick in order to increase possibility of capturing a photon. However, since the thick P-type layer increases possibility that excited electrons are recombined with holes before reaching a P-N junction, the efficiency of the silicon solar cell remains in the range of about 7% to about 15%.

To solve these problems, Korean Patent Publication No, 10-2013-0102667 (Application No 10-2012-0023636) discloses a dye-sensitized solar cell using a semiconductor electrode layer including metal oxide nanotubes containing metal nanoparticles, and Korean Patent Publication No. 10-2009-0124094 (Application No. 10-2008-000050097) discloses a quantum dot-sensitized photovoltaic cell of which a photovoltaic conversion efficiency is improved by forming a CdS light absorption layer at a porous titania layer by a spray pyrolysis technique and by forming a $TiO_2$ nanoparticle in a $TiCl_4$ solution.

SUMMARY

Embodiments of the inventive concepts may provide titanium oxide having a hexagonal column shape and a method of fabricating the same.

Embodiments of the inventive concepts may also provide hexagonal column-shaped titanium oxide capable of simplifying fabricating processes and of reducing a fabrication cost and a method of fabricating the same.

Embodiments of the inventive concepts may also provide a solar cell including titanium oxide having a hexagonal column shape and a method of fabricating the same.

Embodiments of the inventive concepts may also provide a solar cell capable of improving photovoltaic energy conversion efficiency and a method of fabricating the same.

Embodiments of the inventive concepts may also provide a high-reliable solar cell and a method of fabricating the same.

In an aspect, a method of fabricating titanium oxide having a hexagonal column shape may include preparing a first mixture solution containing oxalic acid and sodium dodecylbenzenesulfonate (SDBS), and adding a second mixture solution including titanium to the first mixture solution to fabricate titanium oxide having a hexagonal column shape.

In some embodiments, the method may further include thermally treating the first mixture solution to allow the first mixture solution to have a first temperature, before the adding of the second mixture solution to the first mixture solution.

In some embodiments, the adding of the second mixture solution to the first mixture solution to fabricate the titanium oxide having the hexagonal column shape may include sequentially adding portions of the second mixture solution to the thermally treated first mixture solution at time intervals.

In some embodiments, the adding of the second mixture solution to the first mixture solution to fabricate the titanium oxide having the hexagonal column shape may include reacting the first mixture solution and the second mixture solution with each other at a second temperature for a reference time to fabricate an intermediate product having a hexagonal column shape.

In some embodiments, the first temperature may be equal to the second temperature.

In some embodiments, the adding of the second mixture solution to the first mixture solution to fabricate the titanium oxide having the hexagonal column shape may include separating the intermediate product having the hexagonal column shape after the reacting of the first mixture solution and the second mixture solution, drying the intermediate product having the hexagonal column shape, and thermally treating the intermediate product having the hexagonal column shape to fabricate the titanium oxide having the hexagonal column shape in a powder state.

In some embodiments, the amount of the oxalic acid may be greater than the amount of the SDBS.

In some embodiments, the SDBS may adjust pores of the titanium oxide having the hexagonal column shape and/or a height of the titanium oxide having the hexagonal column shape.

In an aspect, a solar cell may include may include a photoelectric conversion layer including an electrode particle layer including a hexagonal column-shaped titanium oxide layer disposed on a first substrate, and a light absorption layer adsorbed to the electrode particle layer, a second substrate facing the first substrate, an electrode layer on the second substrate, and an electrolyte solution between the photoelectric conversion layer and the electrode layer.

In some embodiments, the electrode particle layer may further include a porous metal particle layer disposed between the hexagonal column-shaped titanium oxide layer and the first substrate.

In some embodiments a thickness of the hexagonal column-shaped titanium oxide layer may be greater than a thickness of the porous metal particle layer.

In some embodiments, the porous metal particle layer may include titanium oxide.

In an aspect, a method of fabricating a solar cell may include preparing a first substrate, forming an electrode particle layer including a hexagonal column-shaped titanium oxide layer on the first substrate, adsorbing a light absorption layer to the electrode particle layer, disposing a second substrate having an electrode layer in such a way that the second substrate faces the first substrate, and injecting an electrolyte solution between the first substrate and the second substrate.

In some embodiments, the forming of the electrode particle layer may include forming a porous metal particle layer on the first substrate by using the same process as the hexagonal column-shaped titanium oxide layer before formation of the hexagonal column-shaped titanium oxide layer.

In some embodiments, the forming of the electrode particle layer may include forming the porous metal particle layer and the hexagonal column-shaped titanium oxide layer a plurality of times by using the same processes as each other.

BRIEF DESCRIPTION OF THE DRAWINGS

FIG. 5 is a SEM image showing titanium oxide fabricated using a first mixture solution from which oxalic acid is omitted according to a comparative example.

DETAILED DESCRIPTION OF THE EMBODIMENTS

Figure 1:
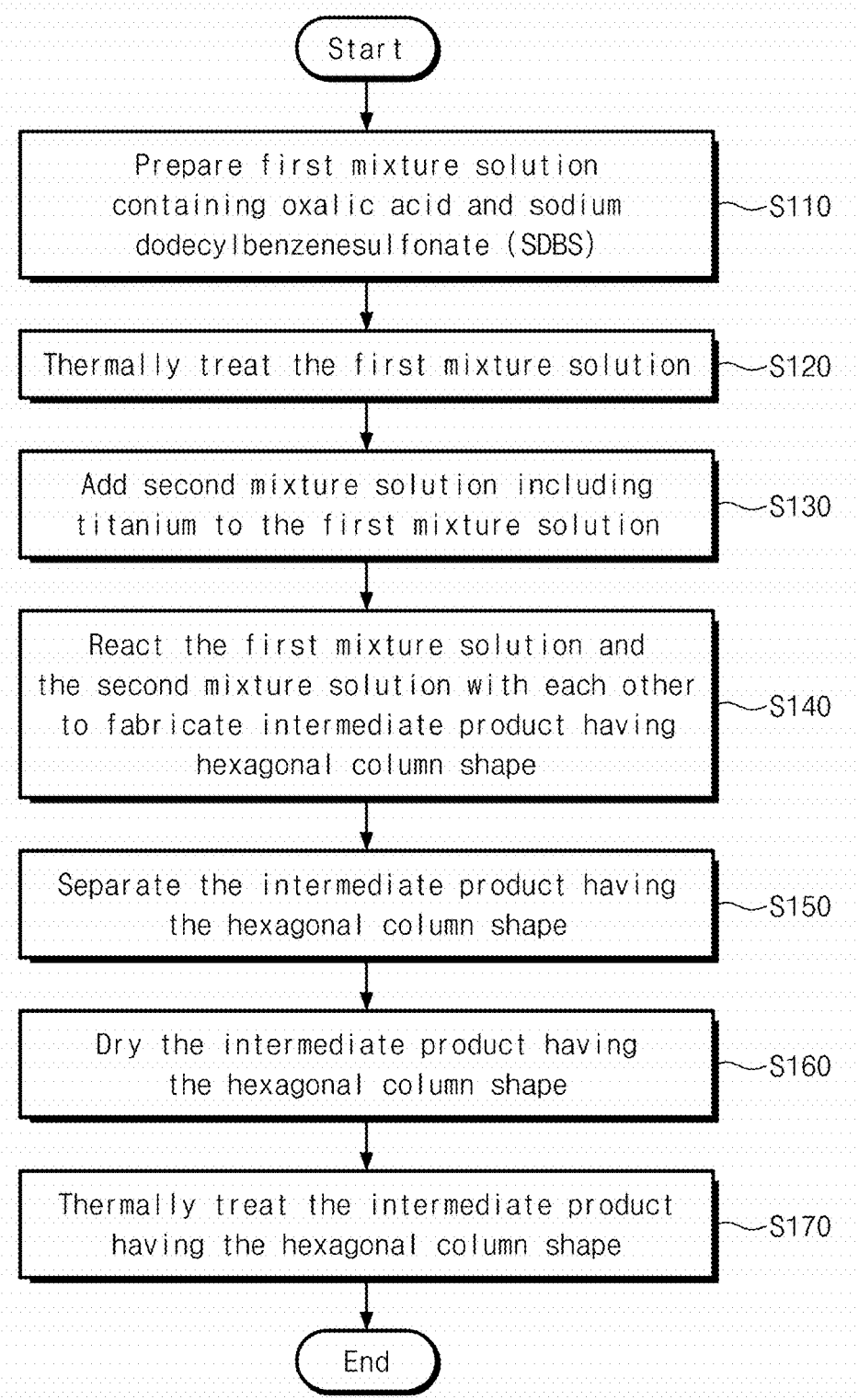
FIG. 1 is a flow chart illustrating a method of fabricating titanium oxide having a hexagonal column shape, according to some embodiments of the inventive concepts.

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIG. 1 is a flow chart illustrating a method of fabricating titanium oxide having a hexagonal column shape, according to some embodiments of the inventive concepts.

Referring to FIG. 1, a first mixture solution including oxalic acid and sodium dodecylbenzenesulfonate (SDBS) may be prepared (S110). The oxalic acid included in the first mixture solution may have a structure expressed by the following chemical formula 1, and the SDBS included in the first mixture solution may have a structure expressed by the following chemical formula 2.

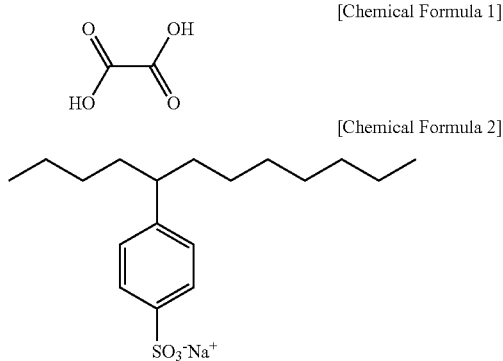

[Chemical Formula 1]

[Chemical Formula 2]

According to some embodiments, the first mixture solution may be a mixture solution of ethanol and deionized (DI) water to which the oxalic acid and the SDBS are added. The amount of the oxalic acid added in the DI water may be greater than the amount of the SDBS added in the DI water. For example, the first mixture solution may be prepared by mixing 30 ml of the ethanol with 90 ml of the DI water to which 2 g of the oxalic acid and 0.2 g of the SDBS are added.

The first mixture solution may be thermally treated (S120). The first mixture solution thermally treated may have a first temperature. For example, the first temperature may be 90 degrees Celsius. The first mixture solution may be thermally treated while being stirred under reflux.

A second mixture solution may be added to the first mixture solution thermally treated (S130). Portions of the second mixture solution may be sequentially added at time intervals to the first mixture solution. For example, the portions of the second mixture solution, each of which has the amount of 1 ml, may be sequentially added at the time intervals to the first mixture solution.

The second mixture solution may include titanium. According to some embodiments, the second mixture solution may include titanium butoxide (TBT). For example, the second mixture solution may be prepared by adding 5 ml of the TBT and 0.3 ml of acetic acid into 60 ml of ethanol.

The first mixture solution may react with the second mixture solution to fabricate an intermediate product has having a hexagonal column shape (S140). The intermediate product fabricated by the reaction of the first and second mixture solutions may be hydroxyl titanium oxalate.

The first mixture solution may react with the second mixture solution at a second temperature for a reference time. According to some embodiments, the second temperature may be substantially equal to the first temperature (e.g., 90 degrees Celsius) corresponding to the thermal treatment temperature of the first mixture solution. For example, the reference time may be 4 hours.

The intermediate product having the hexagonal column shape may be separated from the first mixture solution and the second mixture solution (S150). According to some embodiments, the intermediate product having the hexagonal column shape may be separated by a centrifugal method, and the intermediate product having the hexagonal column shape may be cleaned using DI water and ethanol.

The separated intermediate product having the hexagonal column shape may be dried (S160). According to some embodiments, the intermediate product having the hexagonal column shape may be dried using a vacuum oven at 80 degrees Celsius for 2 hours.

The dried intermediate product having the hexagonal column shape may thermally treated (S170). The intermediate product having the hexagonal column shape may be thermally treated to fabricate titanium oxide having a hexagonal column shape in a powder state. According to some embodiments, the intermediate product having the hexagonal column shape may be thermally treated at 450 degrees Celsius for 5 hours.

Figure 2:
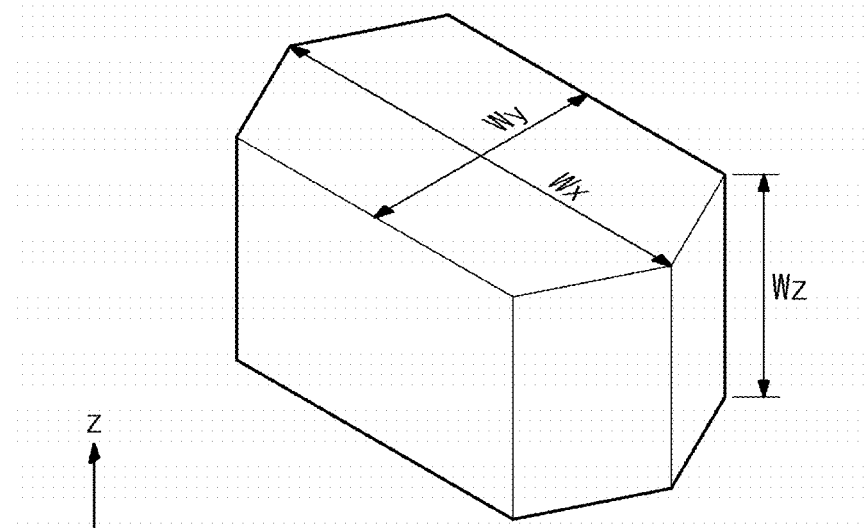
FIG. 2 illustrates titanium oxide having the hexagonal column shape, which is formed by a fabricating method according to some embodiments of the inventive concepts.

FIG. 2 illustrates titanium oxide having the hexagonal column shape, which is formed by a fabricating method according to some embodiments of the inventive concepts.

The titanium oxide having the hexagonal column shape may be titanium dioxide ($TiO_2$). The titanium oxide having the hexagonal column shape may include a bottom surface having a hexagonal shape, a top surface having a hexagonal shape, and six side surfaces.

The bottom surface and the top surface of the titanium oxide having the hexagonal column shape may be parallel to a first direction (an x-axis direction in FIG. 2) and a second direction (a y-axis direction in FIG. 2) perpendicular to the first direction. The bottom surface and the top surface of the titanium oxide having the hexagonal column shape may have a substantially same area and may have a substantially same shape.

Each of the top surface and the bottom surface of the titanium oxide having the hexagonal column shape may include two long sides and four short sides. The long sides of the titanium oxide having the hexagonal column shape may be longer than the short sides thereof. Lengths of the short sides of the top surface and the bottom surface may be equal to each other.

The long sides of the titanium oxide having the hexagonal column shape may extend in the first direction (the x-axis direction). Thus, a width Wx, in the first direction (the x-axis direction), of the titanium oxide having the hexagonal column shape may be greater than a width Wy, in the second direction (the y-axis direction), of the titanium oxide having the hexagonal column shape.

The six side surfaces of the titanium oxide having the hexagonal column shape may be perpendicular to the first direction (the x-axis direction) and the second direction (the y-axis direction) and may be parallel to a third direction (a z-axis direction in FIG. 2) perpendicular to the first direction (the x-axis direction) and the second direction (the y-axis direction).

Two side surfaces, facing each other, among the six side surfaces of the titanium oxide having the hexagonal column shape may be parallel to each other. The six side surfaces of the titanium oxide having the hexagonal column shape may include two large-area side surfaces and four small-area side surfaces. The two large-area side surfaces may be connected to the long sides of the top surface and the bottom surface. An area of each of the two large-area side sea faces may be greater than an area of each of the four small-area side surfaces.

The two large-area side surfaces and the four small-area side surfaces may have the same height in the third direction (the z-axis direction). A width Wz (i.e., a height), in the third direction (the z-axis direction), of the titanium oxide having the hexagonal column shape may be adjusted according to a concentration of the SDBS added to the first mixture solution described with reference to FIG. 1. According to some embodiments, the width Wz (i.e., the height), in the third direction (the z-axis direction), of the titanium oxide having the hexagonal column shape may decrease as the concentration of the SDBS increases, and the width Wz (i.e., the height), in the third direction (the z-axis direction), of the titanium oxide having the hexagonal column shape may increase as the concentration of the SDBS decreases. The SDBS may adjust the amount of pores of the titanium oxide having the hexagonal column shape.

Unlike FIG. 2, a bottom surface and a top surface of titanium oxide having a hexagonal column shape according to other embodiments of the inventive concepts may have regular hexagon shapes.

Figure 3:
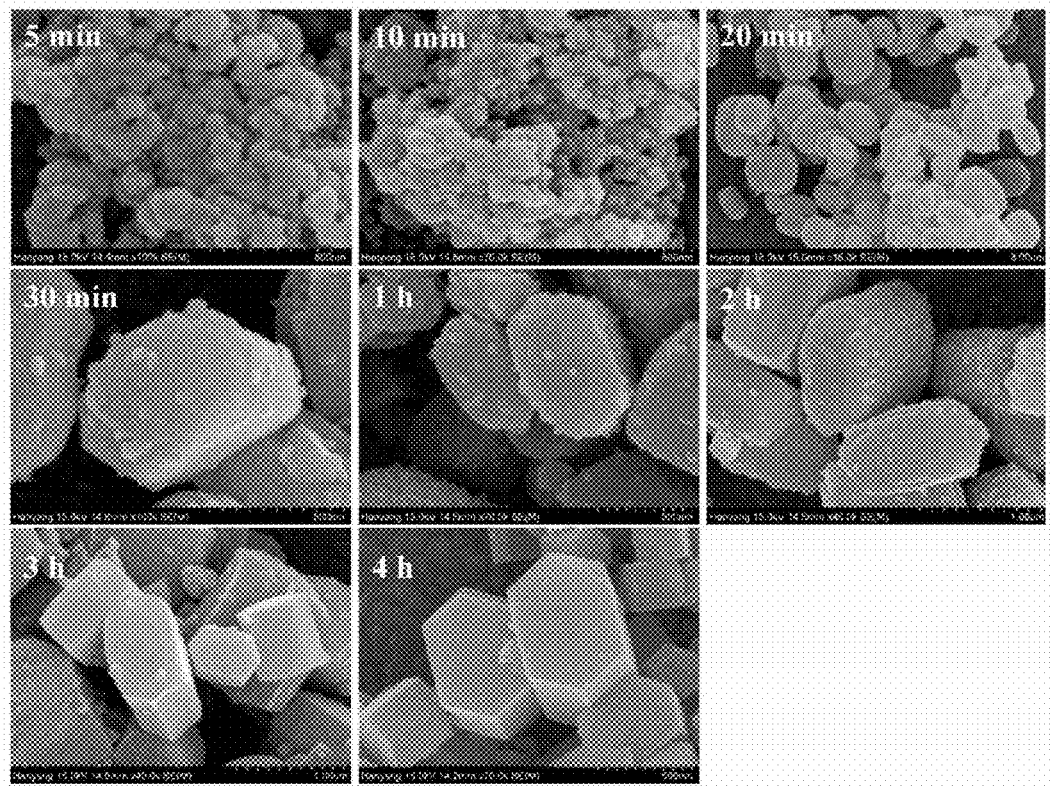
FIG. 3 is a scanning electron microscope (SEM) image showing a hexagonal column-shaped intermediate product fabricated by a method of fabricating titanium oxide having a hexagonal column shape according to some embodiments of the inventive concepts.
Figure 4:
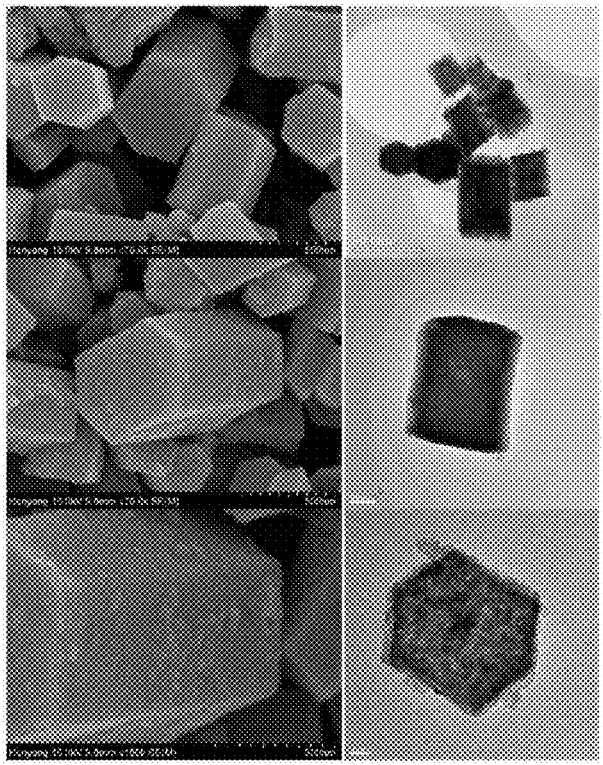
FIG. 4 is a SEM image showing titanium oxide having the hexagonal column shape, which is fabricated by a fabricating method according to some embodiments of the inventive concepts.

FIG. 3 is a scanning electron microscope (SEM) image showing a hexagonal column-shaped intermediate product fabricated by a method of fabricating titanium oxide having a hexagonal column shape according to some embodiments of the inventive concepts, and FIG. 4 is a SEM image showing titanium oxide having the hexagonal column shape, which is fabricated by a fabricating method according to some embodiments of the inventive concepts.

Referring to FIGS. 3 and 4, 2 g of oxalic acid and 0.2 g of sodium dodecylbenzenesulfonate (SDBS) were added to 90 ml of DI water, and the DI water added with the oxalic acid and the SDBS was mixed with 30 ml of ethanol to prepare a first mixture solution. In addition, 5 ml of titanium butoxide (TBT) and 0.3 ml of acetic acid were mixed with 60 ml of ethanol to prepare a second mixture solution.

After the first mixture solution was thermally treated to have 90 degrees Celsius, 1 ml of the second mixture solution including titanium was repeatedly added to the first mixture solution of 90 degrees Celsius. After the second mixture solution was added to the first mixture solution, the first mixture solution reacted with the second mixture solution at 90 degrees Celsius for four hours, thereby fabricating an intermediate product (hydroxyl titanium oxalate). As shown in FIG. 3, it can be recognized that a shape of the intermediate product becomes closer to the hexagonal column shape as the reaction time of the first and second mixture solutions passes.

After the reaction of the first mixture solution and the second mixture solution, a centrifugal machine was operated at 7500 rpm for 20 minutes to separate the intermediate product having the hexagonal column shape. Thereafter, the intermediate product having the hexagonal column shape was cleaned one time by DI water and was cleaned one time by ethanol.

Thereafter, the cleaned intermediate product having the hexagonal column shape was dried using a vacuum oven at 80 degrees Celsius for two hours and was thermal treated at 450 degrees Celsius for five hours, thereby fabricating titanium oxide (titanium dioxide) having a hexagonal column shape, as shown in FIG. 4. It can be recognized that the titanium oxide having the hexagonal column shape is fabricated using the oxalic acid and the SDBS according to some embodiments of the inventive concepts.

FIG. 5 is a SEM image showing titanium oxide fabricated using a first mixture solution from which oxalic acid s omitted according to a comparative example.

Referring to FIG. 5, titanium oxide was fabricated using a first mixture solution, from which oxalic acid was omitted, by the method described with reference to FIGS. 3 and 4. A reference designator (a) of FIG. 5 is a SEM image of an immediate product generated by adding the second mixture solution described with reference to FIGS. 3 and 4 to the first mixture solution not having the oxalic acid and by reacting the first and second mixture solutions with each other at 90 degrees Celsius for four hours. A reference designator (b) of FIG. 5 is a SEM image of titanium oxide generated by drying and thermally treating the intermediate product according to the comparative example by the method described with reference to FIGS. 3 and 4. As shown in FIG. 5, it can be recognized that the intermediate product and the titanium oxide do not have hexagonal column shapes when the oxalic acid is not added to the first mixture solution.

Application examples of the titanium oxide having the hexagonal column shape according to some embodiments of the inventive concepts will be described hereinafter.

Figure 6:
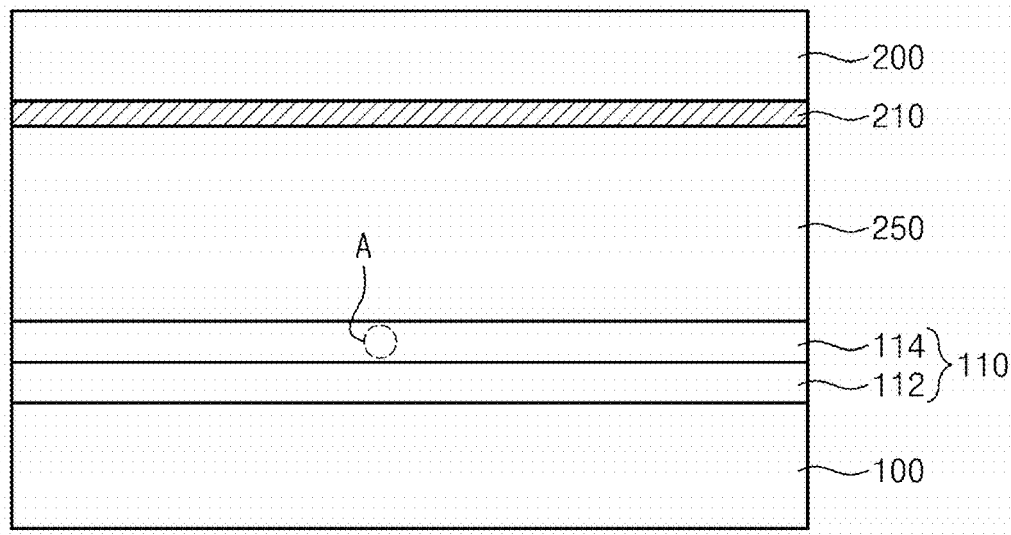
FIG. 6 is a view illustrating a solar cell including titanium oxide having the hexagonal column shape and a method of fabricating the same, according to some embodiments of the inventive concepts.
Figure 7:
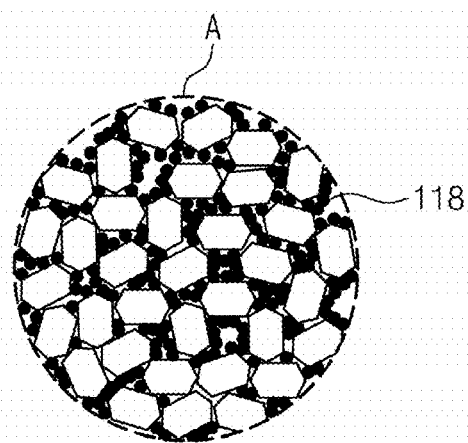
FIG. 7 is an enlarged view of a portion 'A' of FIG. 6.

FIG. 6 is a view illustrating a solar cell including titanium oxide having the hexagonal column shape and a method of fabricating the same, according to some embodiments of the inventive concepts, and FIG. 7 is an enlarged view of a portion 'A' of FIG. 6.

Referring to FIGS. 6 and 7, a first substrate 100 is provided. The first substrate 100 may include one surface and another surface opposite to the one surface. The first substrate 100 may be formed of a transparent conductive material. For example, the first substrate 100 may be a fluorine-doped tin oxide (FTO) substrate or an indium tin oxide (ITO) substrate. Alternatively, the first substrate 100 may include at least one of metals or metal alloys, or the first substrate 100 may be a glass coated with a conductive layer or a polymer film coated with a conductive layer. The first substrate 100 may be flexible.

A photoelectric conversion layer 110 may be formed on the one surface of the first substrate 100. The first substrate 100 may be ultrasonically cleaned using hydrochloric acid, acetone, ethanol, and DI water before the formation of the photoelectric conversion layer 110.

Forming the photoelectric conversion layer 110 may include forming an electrode particle layer 112 and 114 on the one surface of the first substrate 100, and forming a light absorption layer 118 adsorbed to the electrode particle layer 112 and 114. Forming the electrode particle layer 112 and 114 may include forming a porous metal particle layer 112 on the one surface of the first substrate 100, and forming a hexagonal column-shaped titanium oxide layer 114 on the porous metal particle layer 112.

Forming the hexagonal column-shaped titanium oxide layer 114 may include preparing titanium oxide having a hexagonal column shape in a powder state by the method described with reference to FIG. 1, forming the powder state of the titanium oxide having the hexagonal column shape into a paste state, and forming the hexagonal column-shaped titanium oxide layer 114 on the porous metal particle layer 112 by using the titanium oxide having the hexagonal column shape in the paste state.

The porous metal particle layer 112 and the hexagonal column-shaped titanium oxide layer 114 may include the same metal oxide. The porous metal particle layer 112 may include mesoporous titanium dioxide ($TiO_2$), and the hexagonal column-shaped titanium oxide layer 114 may include titanium dioxide ($TiO_2$) having the hexagonal column shape. Alternatively, the porous metal particle layer 112 may include at least one of $SnO_2$, $ZrO_2$, $SiO_2$, $MgO_2$, $Nb_2O_5$, or ZnO.

The porous metal particle layer 112 and the hexagonal column-shaped titanium oxide layer 114 may be formed using the same process. For example, the porous metal particle layer 112 and the hexagonal column-shaped titanium oxide layer 114 may be formed using a screen printing process or a spin coating process. The porous metal particle layer 112 and the hexagonal column-shaped titanium oxide layer 114 may be formed a plurality of times by using the screen printing process or the spin coating process. A thickness of the hexagonal column-shaped titanium oxide layer 114 may be greater than a thickness of the porous metal particle layer 112.

Each of the porous metal particle layer 112 and the hexagonal column-shaped titanium oxide layer 114 may be a multi-layer. In this case, the number of the layers of the porous metal particle layer 112 may be equal to the number of the layers of the hexagonal column-shaped titanium oxide layer 114.

The light absorption layer 118 may be adsorbed to a surface of a porous metal particle included in the porous metal particle layer 112 and a surface of a hexagonal column-shaped titanium oxide particle included in the hexagonal column-shaped titanium oxide layer 114. The light absorption layer 118 absorbs incident sunlight.

According to some embodiments, the light absorption layer 118 may be a dye layer. In this case, the light absorption layer 118 may be a ruthenium adsorbent. For example, the dye may be Ru(dcbpy)2(NCS)2 containing 2 protons (N719). Also, the dye may be at least one of dyes such as N712, Z907, Z910, and K19. Alternatively, the light absorption layer 118 may include quantum dots.

When the light absorption layer 118 is the dye layer, forming the light absorption layer 118 may include pretreating the first substrate 100 having the electrode particle layer 112 and 114 with nitric acid, and adsorbing the dye layer to the electrode particle layer 112 and 114. For example, pretreating the first substrate 100 may include immersing the first substrate 100 in 0.1 nitric acid for about 15 minutes, and cleaning the first substrate 100 by DI water and ethanol.

A second substrate 200 is provided. The second substrate 200 may be the same substrate as the first substrate 100. The second substrate 200 may include one surface and another surface opposite to the one surface.

An electrode layer 210 may be formed on the one surface of the second substrate 200. For example, the electrode layer 210 may be fumed by sputtering platinum (Pt) onto the one surface of the second substrate 200. The second substrate 200 may be ultrasonically cleaned using hydrochloric acid, acetone, ethanol, and DI water before the formation of the electrode layer 210.

The first substrate 100 and the second substrate 200 are assembled with each other. An electrolyte solution 250 may be injected between the first substrate 100 and the second substrate 200. The electrolyte solution 250 may be a redox iodide electrolyte.

The solar cell according to some embodiments of the inventive concepts may include the porous metal particle layer 112 and the hexagonal column-shaped titanium oxide layer 114 on the porous metal particle layer 112. Light incident on the hexagonal column-shaped titanium oxide layer 114 may be scattered to provide the solar cell with improved photovoltaic conversion efficiency and the method of fabricating the same.

A fabrication example and characteristics of the solar cell including the hexagonal column-shaped titanium oxide layer according to some embodiments of the inventive concepts will be described hereinafter.

Figure 8:
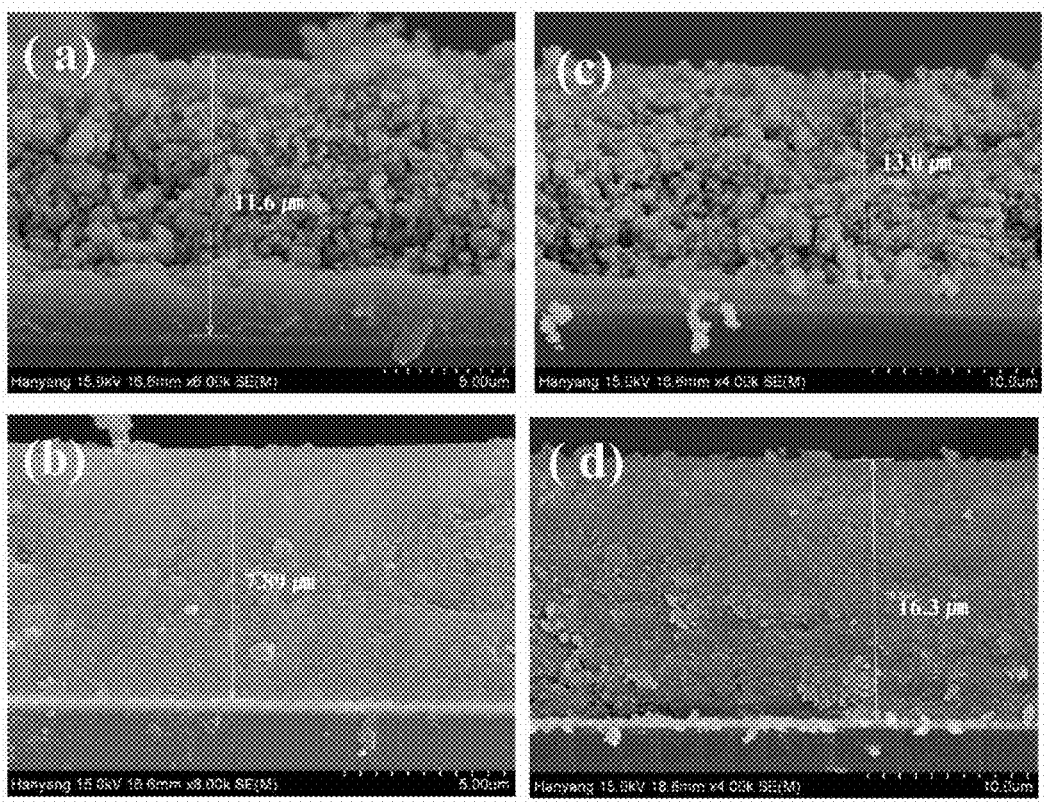
FIG. 8 shows SEM images of photoelectric conversion layers included in solar cells according to an embodiment example of the inventive concepts and comparative examples.

FIG. 8 shows SEM images of photoelectric conversion layers included in solar cells according to an embodiment example of the inventive concepts and comparative examples.

Referring to FIG. 8, hexagonal column-shaped titanium dioxide in a powder state was fabricated by the method described with reference to FIGS. 3 and 4. 6 g of the hexagonal column-shaped titanium dioxide in the powder state, 1 ml of acetic acid, and 50 ml of ethanol were mixed with each other to prepare a solution, and 1.5 g of ethyl cellulose (46070), 1.5 g of ethyl cellulose (46080), 20 ml of terpineol, and 60 ml to 70 ml of ethanol were mixed with each other to prepare a solution. Each of the solutions was stirred for one hour. Thereafter, the two solutions were stirred for two hours and were then evaporated using a rotary evaporator to fabricate hexagonal column-shaped titanium dioxide in a paste state.

A FTO glass was prepared as a first substrate. The FTO glass was ultrasonic-cleaned using hydrochloric acid, acetone, ethanol, and DI water in the order named, and a cleaning time of each of hydrochloric acid, acetone, ethanol, and DI water was 30 minutes. The cleaned FTO glass was immersed in a 40 mM TiCl$_4$ solution of 70 degrees Celsius.

The FTO glass treated with TiCl$_4$ was coated three times with porous titanium dioxide paste by using a screen printing process. After the FTO glass was coated three times with the porous titanium dioxide paste, the FTO glass was coated three times with the hexagonal column-shaped titanium dioxide fabricated in the paste state and was then thermally treated at 550 degrees Celsius for one hour.

Thereafter, the FTO glass coated with the porous titanium dioxide layer and the hexagonal column-shaped titanium dioxide layer was immersed in a 40 mM TiCl$_4$ solution of 70 degrees Celsius for 30 minutes and was then thermally treated at 450 degrees Celsius. The thermally treated FTO glass was immersed in a 0.1 M nitric acid solution at room temperature for 15 minutes and was then rinsed using DI water and ethanol. Thereafter, the FTO glass was immersed in a 0.5 mM dye solution, and a reaction process of the FTO glass was performed in an oven of 40 degrees Celsius for two hours. Next, the FTO glass was rinsed using ethanol.

A FTO glass was prepared as a second substrate. The FTO glass was ultrasonic-cleaned using hydrochloric acid, acetone, ethanol, and DI water in the order named, and a cleaning time of each of hydrochloric acid, acetone, ethanol, and DI water was 30 minutes. Thereafter, a platinum layer was deposited on the FTO glass by a sputtering process, and the two FTO substrates were assembled with each other. An electrolyte was injected between the two FTO substrates to fabricate a dye-sensitized solar cell.

A reference designator (a) of FIG. 8 shows the porous titanium dioxide layer and the hexagonal column-shaped titanium dioxide layer included in the solar cell fabricated according to the aforementioned embodiment example of the inventive concepts. According to a comparative example 1, the formation of the hexagonal column-shaped titanium dioxide layer was omitted and the FTO glass was coated six times with the porous titanium dioxide in the method of fabricating the solar cell according to the aforementioned embodiment example of the inventive concepts, thereby fabricating a solar cell. A reference designator (b) of FIG. 8 shows a porous titanium dioxide layer included in the solar cell according to the comparative example 1. According to a comparative example 2, the porous titanium dioxide layer was omitted and the FTO glass was coated six times with the hexagonal column-shaped titanium dioxide in the method of fabricating the solar cell according to the aforementioned embodiment example of the inventive concepts, thereby fabricating a solar cell. A reference designator (c) of FIG. 8 shows a hexagonal column-shaped titanium dioxide layer included in the solar cell according to the comparative example 2. According to a comparative example 3, the porous titanium dioxide layer and the hexagonal column-shaped titanium dioxide layer were omitted and the FTO glass was coated six times with titanium dioxide having particles sizes of about 400 nm and about 20 nm in the method of fabricating the solar cell according to the aforementioned embodiment example of the inventive concepts, thereby fabricating a solar cell. A reference designator (d) of FIG. 8 shows a titanium dioxide layer included in the solar cell according to the comparative example 3.

Figure 9:
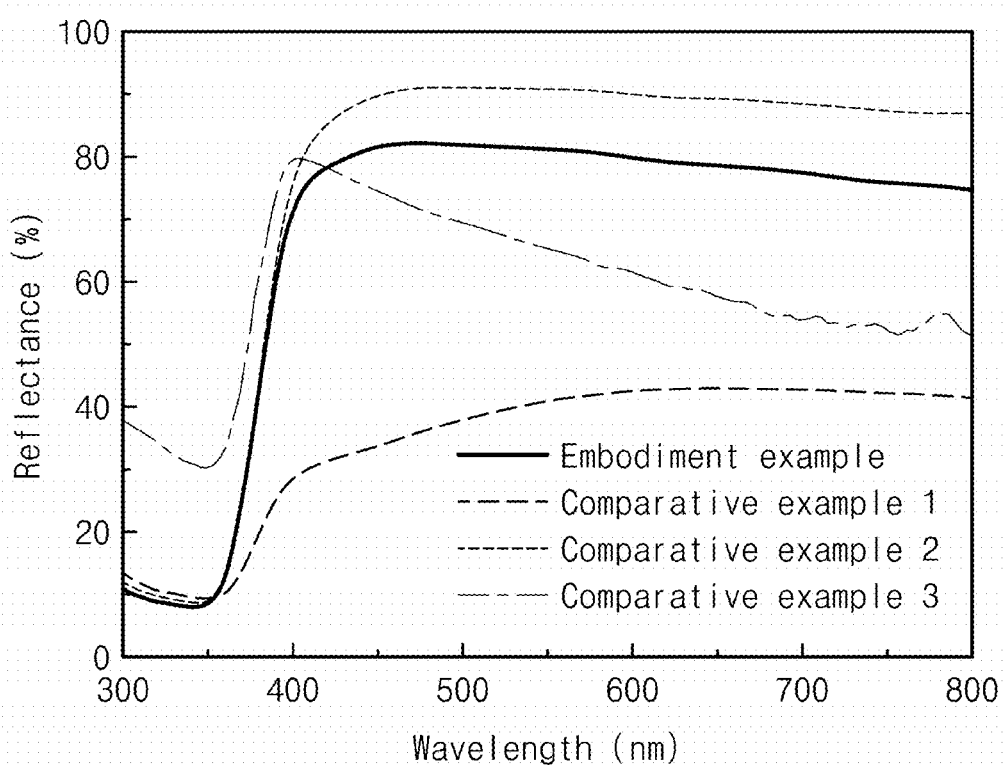
FIG. 9 shows measured reflectance as wavelength of solar cells according to an embodiment example of the inventive concepts and comparative examples.
Figure 10:
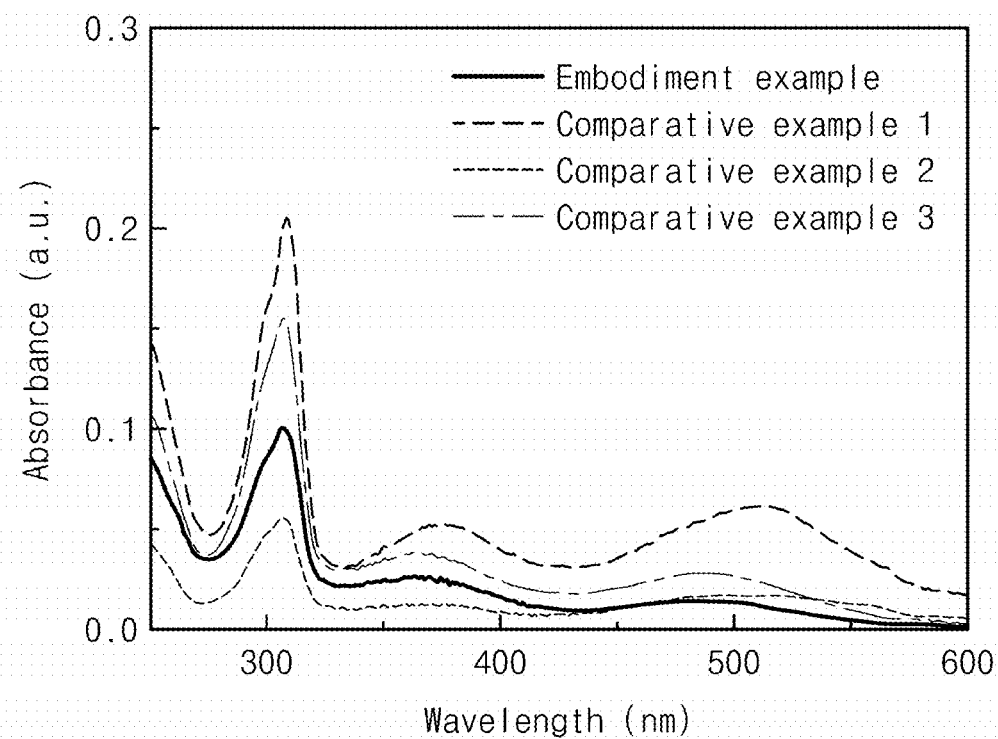
FIG. 10 shows measured absorbance as wavelength of solar cells according to an embodiment example of the inventive concepts and comparative examples.

FIG. 9 shows measured reflectance as wavelength of solar cells according to an embodiment example of the inventive concepts and comparative examples, and FIG. 10 shows measured absorbance as wavelength of solar cells according to an embodiment example of the inventive concepts and comparative examples.

Referring to FIG. 9, the solar cell of the comparative example 1, from which the hexagonal column-shaped titanium dioxide layer is omitted and which is coated with the porous titanium dioxide, has the lowest reflectance at a wavelength of about 400 nm or more. The solar cell of the comparative example 3, from which the porous titanium dioxide layer and the hexagonal column-shaped titanium dioxide layer are omitted and which is coated with the titanium dioxide having the particle sizes of about 400 nm and about 20 nm, has the next lowest reflectance at the wavelength of about 400 nm or more.

The solar cell including the porous titanium dioxide layer and the hexagonal column-shaped titanium dioxide layer according to the embodiment example of the inventive concepts has a reflectance higher than those of the solar cells according to the comparative examples 1 and 3. In addition, the solar cell of the comparative example 2, from which the porous titanium dioxide layer is omitted and which is coated with the hexagonal column-shaped titanium dioxide, has the highest reflectance.

Referring to FIG. 10, in response to the reflectance characteristics of the solar cells according to the embodiment example and the comparative examples described with reference to FIG. 9, the solar cell according to the comparative example 1 has the highest absorbance and the solar cell according to the comparative example 3 has the next highest absorbance. The solar cell including the porous titanium dioxide layer and the hexagonal column-shaped titanium dioxide layer according to the embodiment example of the inventive concepts has an absorbance lower than those of the solar cells according to the comparative examples 1 and 3. In addition, the solar cell according to the comparative example 2 has the lowest absorbance.

Figure 11:
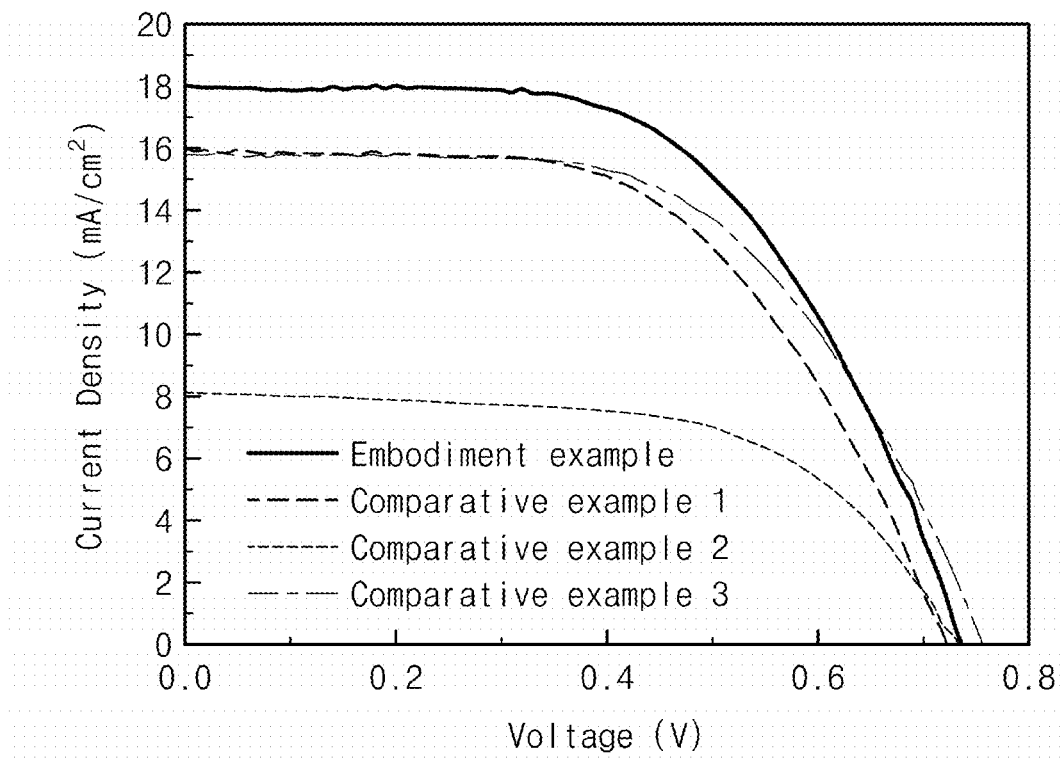
FIG. 11 is a graph showing current density versus voltage of solar cells according to an embodiment example of the inventive concepts and comparative examples.

FIG. 11 is a graph showing current density versus voltage of solar cells according to an embodiment example of the inventive concepts and comparative examples.

Referring to FIG. 11, the solar cell including the porous titanium dioxide layer and the hexagonal column-shaped titanium dioxide layer according to the embodiment example of the inventive concepts has the highest current density, and the solar cells according to the comparative examples 1 and 3 have current densities that are next highest and are similar to each other. The solar cell according to the comparative example 2 has the lowest current density. In detail, short-circuit current densities, open-circuit voltages, fill factors, and photovoltaic conversion efficiencies of the solar cells according to the embodiment example and the comparative examples 1 to 3 were measured, and the measured values are shown in the following table 1.

TABLE 1

| Division | Short-circuit current density (mA/cm$^2$) | Open-circuit voltage (V) | Fill factor | Efficiency (%) |
|---|---|---|---|---|
| Embodiment Example | 18.0 | 0.737 | 0.570 | 7.58 |
| Comparative Example 1 | 16.0 | 0.732 | 0.558 | 6.44 |
| Comparative Example 2 | 8.18 | 0.733 | 0.593 | 3.55 |
| Comparative Example 3 | 15.8 | 0.757 | 0.577 | 6.88 |

In FIGS. 9 and 10, the reflectance of the solar cell according to the embodiment example is higher than those of the solar cells according to the comparative examples 1 and 3, and the absorbance of the solar cell according to the embodiment example is lower than those of the solar cells according to the comparative examples 1 and 3. However, as shown in the table 1, it can be recognized that the photovoltaic conversion efficiency of the solar cell including the porous titanium dioxide layer and the hexagonal column-shaped titanium dioxide layer according to the embodiment example of the inventive concepts are higher than the photovoltaic conversion efficiencies of the solar cells according to the comparative examples 1 to 3. In other words, it can be recognized that the scattering of incident light by using the hexagonal column-shaped titanium dioxide layer effectively improves the photovoltaic conversion efficiency characteristic.

Application examples of the solar cell according to embodiments of the inventive concepts will be described.

Figure 12:
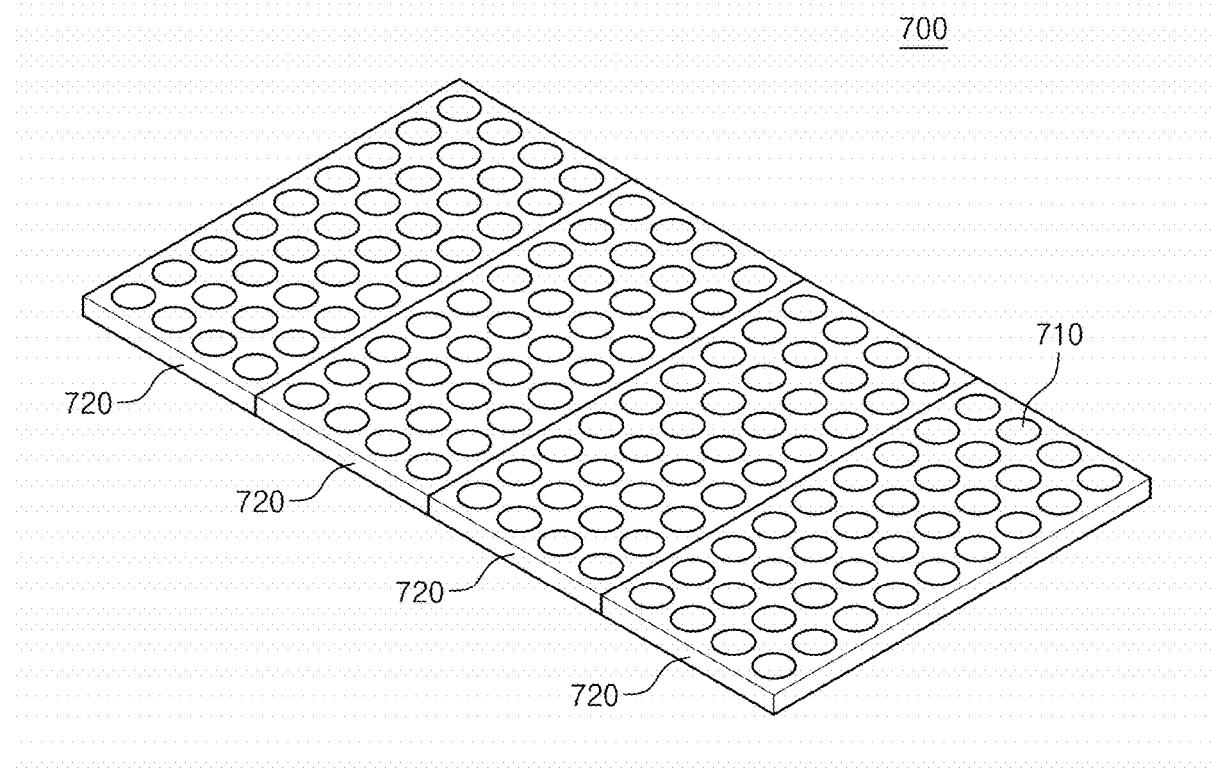
FIG. 12 is a view illustrating a solar cell array using a solar cell according to some embodiments of the inventive concepts.

FIG. 12 is a view illustrating a solar cell array using a solar cell according to some embodiments of the inventive concepts.

Referring to FIG. 12, a solar cell array 700 may be formed by installing at least one or more solar cell modules 720 in a main frame (not shown). The solar cell modules 720 may include a plurality of solar cells 710. The solar cell 710 may be the solar cell according to embodiments of the inventive concepts. The solar cell array 700 may be equipped at a predetermined angle toward the south in order to easily receive the light of the sun.

The solar cell module or the solar cell array described above may be used to a car, a house, a building, a boat, a light tower, a traffic signal system, a portable electronic device, or various structures.

Figure 13:
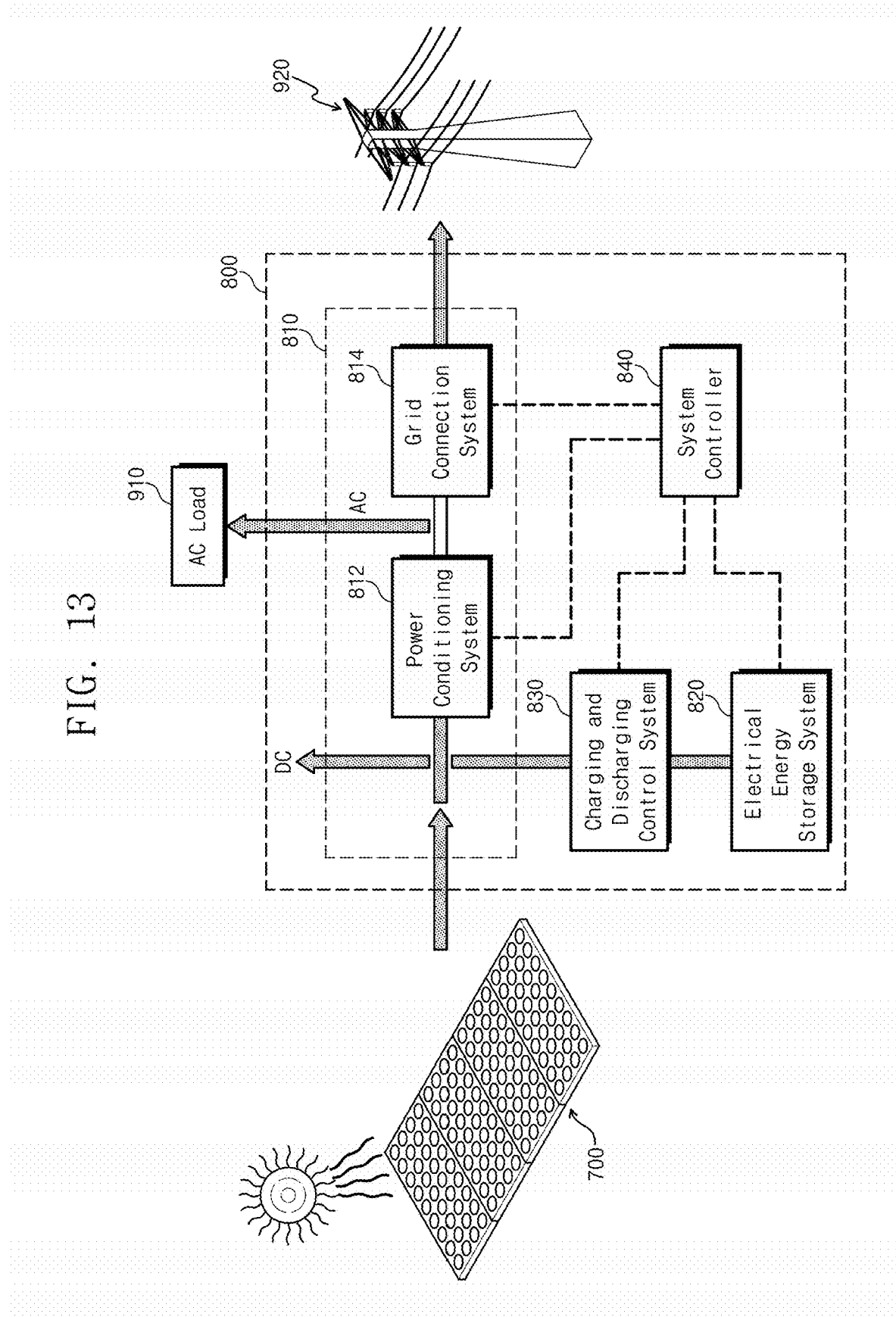
FIG. 13 is a schematic diagram illustrating an example of a solar photovoltaic power generation system using a solar cell according to some embodiments of the inventive concepts.

FIG. 13 is a schematic diagram illustrating an example of a solar photovoltaic power generation system using a solar cell according to some embodiments of the inventive concepts.

Referring to FIG. 13, the solar photovoltaic power generation system may include the solar cell array 700, and a power control system 800 receiving electric power from the solar cell array 700 to transmit the electric power to an external system. The power control system 800 may include an output system 810, an electrical energy storage system 820, a charging and discharging control system 830 and a system controller 840. The output system 810 may include a power conditioning system (PCS) 812.

The power conditioning system (PCS) 812 may correspond to an inverter that converts a direct current (DC) received from the solar cell array 700 into an alternating current (AC). Since the light of the sun does not exist at night and is reduced on cloudy days, generated electric power may be reduced. The electrical energy storage system 820 may store the electric power to prevent the generated electric power from being varied according to the weather. The charging and discharging control system 830 may store the electric power received from the solar cell array 700 into the electrical energy storage system 820 or may output the electric power stored in the electrical energy storage system 820 to the output system 810. The system controller 840 may control the output system 810, the electrical energy storage system 820, and the charging and discharging control system 830.

As described above, the converted AC may be supplied to various AC loads 910 such as a car and a household. In addition, the output system 810 may further include a grid connection system, 814. The grid connection system 814 may be connected to another power system 920 to transmit the electric power to an external system.

According to some embodiments of the inventive concepts, the second mixture solution including titanium may be added to the first mixture solution containing the oxalic acid and the SDBS, thereby fabricating the titanium oxide having the hexagonal column shape.

In addition, the solar cell according to some embodiments of the inventive concepts may include the titanium oxide having the hexagonal column shape. Thus, light incident on the titanium oxide having the hexagonal column shape may be scattered to provide the solar cell with the improved photovoltaic conversion efficiency.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating titanium oxide, the method comprising:
    preparing a first mixture solution comprising oxalic acid and sodium dodecylbenzenesulfonate (SDBS); and
    adding a second mixture solution comprising titanium butoxide to the first mixture solution to fabricate titanium oxide having a hexagonal column shape.

2. The method of claim 1, further comprising: thermally treating the first mixture solution to allow the first mixture solution to have a first temperature, before the adding of the second mixture solution to the first mixture solution.

3. The method of claim 2, wherein the adding of the second mixture solution to the first mixture solution to fabricate the titanium oxide having the hexagonal column shape comprises: sequentially adding portions of the second mixture solution to the thermally treated first mixture solution at time intervals.

4. The method of claim 2, wherein the adding of the second mixture solution to the first mixture solution to fabricate the titanium oxide having the hexagonal column shape comprises: reacting the first mixture solution and the second mixture solution with each other at a second temperature for a reference time to fabricate an intermediate product having a hexagonal column shape.

5. The method of claim 4, wherein the first temperature is equal to the second temperature.

6. The method of claim 4, wherein the adding of the second mixture solution to the first mixture solution to fabricate the titanium oxide having the hexagonal column shape comprises:
    separating the intermediate product having the hexagonal column shape after the reacting of the first mixture solution and the second mixture solution;
    drying the intermediate product having the hexagonal column shape; and
    thermally treating the intermediate product having the hexagonal column shape to fabricate the titanium oxide having the hexagonal column shape in a powder state.

7. The method of claim 1, wherein the amount of the oxalic acid is greater than the amount of the SDBS.

8. The method of claim 1, wherein the SDBS adjusts pores of the titanium oxide having the hexagonal column shape and/or a height of the titanium oxide having the hexagonal column shape.

* * * * *